(12) United States Patent
Sauer

(10) Patent No.: US 6,224,404 B1
(45) Date of Patent: May 1, 2001

(54) APPARATUS FOR REMOVING ELECTRICAL COMPONENT

(75) Inventor: John W. Sauer, Toms River, NJ (US)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/198,953

(22) Filed: Nov. 24, 1998

(51) Int. Cl.⁷ .................................................. H01R 13/62
(52) U.S. Cl. ............................................................. 439/160
(58) Field of Search .................................... 439/159, 160, 439/157, 347

(56) References Cited

U.S. PATENT DOCUMENTS

| | | | |
|---|---|---|---|
| 4,042,292 | * 8/1977 | Chensky | 439/159 |
| 4,496,205 | 1/1985 | Christensen et al. | |
| 4,976,629 | 12/1990 | Werner | 439/259 |
| 5,123,855 | 6/1992 | Petersen | 439/263 |
| 5,575,676 | * 11/1996 | Tsukakoshi et al. | 439/347 |
| 5,593,322 | * 1/1997 | Swamy et al. | 439/660 |
| 5,829,988 | * 11/1998 | McMillan et al. | 439/70 |
| 5,928,013 | * 7/1999 | Iwahori | 439/157 |
| 5,964,603 | * 10/1999 | Hanazaki et al. | 439/157 |
| 5,973,924 | * 10/1999 | Gillespie, Jr. | 439/160 |
| 6,022,229 | * 2/2000 | Nishimura et al. | 439/160 |

FOREIGN PATENT DOCUMENTS

1209568 * 10/1970 (GB).

\* cited by examiner

Primary Examiner—Tulsidas Patel
Assistant Examiner—Javaid Nasri
(74) Attorney, Agent, or Firm—Perman & Green, LLP

(57) ABSTRACT

An extraction device for removing an electrical component from a socket, comprising: an insulative housing; an electrical component receiving surface for receiving the electrical component thereon; and a socket contacting surface for engaging the socket. Movement of the apparatus generally along the socket also moves the apparatus in a direction generally away from the socket to extract the electrical component from the socket. A method of extracting an electrical component from a socket connector assembly, comprising the steps of: providing a socket connector assembly having a socket; and an extraction device engageable with the socket; providing an electrical component on the socket connector assembly; and moving the extraction device relative to the socket.

36 Claims, 13 Drawing Sheets

APPARATUS FOR REMOVING ELECTRICAL COMPONENT

BACKGROUND OF THE INVENTION

1. Field of the Invention

The present invention relates to an apparatus for removing an electrical component from contact with a substrate. More specifically, the present invention relates to an apparatus integratable with a socket connector assembly for extracting an electrical component from the socket connector assembly.

2. Brief Description of Earlier Developments

Socket connector assemblies help secure electrical components, such as integrated circuit (IC) chips, to substrates. An array of pins typically extend from the electrical components. The pins can have any arrangement, including a standard pin grid array (PGA) or an interstitial pin grid array (PZA).

One such socket connector assembly is a low insertion force (LIF) assembly. In a LIF assembly, an array of press-fit sockets reside in openings in the insulator housing. The placement of the sockets corresponds to the locations of the pins on the electrical component. The pins of the electrical component are inserted into the sockets for mating. While offering low insertion forces, these assemblies require an extraction force to remove the electrical component from the socket assembly. The force required to extract the electrical component from the socket increases as the number of pins on the electrical component increases.

In order to remove the electrical component from the LIF assembly, current techniques require a separate extraction tool. The special tool grasps the edges of the electrical component for extraction. The use of the extraction tool has several potential disadvantages. First, the user must have the special extraction tool available. Second, the forces imposed on the edges of the electrical component by the tool may damage the electrical component.

Clearly, there is room for improvement in the art.

SUMMARY OF THE INVENTION

It is an object of the present invention to provide an apparatus for removing an electrical component from contact with a substrate.

It is a further object of the present invention to provide an apparatus for extracting an electrical component from a socket connector assembly.

It is a further object of the present invention to provide an apparatus integratable with a socket connector assembly.

It is a further object of the present invention to provide an apparatus that removes an electrical component from contact with a substrate without damage to the electrical component.

It is a further object of the present invention to provide an apparatus that distributes forces on a larger area of an electrical component when removing the electrical component from contact with a substrate.

It is a further object of the present invention to provide a self-contained apparatus for removing an electrical component from contact with a substrate.

It is a further object of the present invention to provide an apparatus that removes an electrical component from contact with a substrate without assistance from a special extraction tool.

These and other objects of the present invention are achieved in one aspect of the present invention by an extraction tool comprising: an insulative housing; an electrical component receiving surface for receiving the electrical component thereon; and a socket contacting surface for engaging the socket. Movement of the apparatus generally along the socket also moves the apparatus in a direction generally away from the socket to extract the electrical component from the socket.

These and other objects of the present invention are achieved in another aspect of the present invention by a socket for receiving an electrical component have conductive elements. The socket has an insulative housing; a plurality of apertures extending through the housing and corresponding to the conductive elements of the electrical component; and an extraction device engaging surface adapted to engage an extraction device for removing the electrical component from the apertures.

These and other objects of the present invention are achieved in another aspect of the present invention by a kit including a socket and an extraction device. The kit attaches an electrical component having conductive elements to a substrate in an insertion axis. The socket has a plurality of apertures corresponding to the conductive elements of the electrical component. The extraction device moves relative to the socket between a first position and a second position. The extraction device includes a receiving surface for engaging the electrical component. At the first position, the extraction device allows the conductive elements of the electrical component to reside within the apertures of the socket. At the second position, the extraction device withdraws the conductive elements of the electrical component from the apertures of the socket.

These and other objects of the present invention are achieved in another aspect of the present invention by a method of extracting an electrical component from a socket connector assembly, comprising the steps of: providing a socket connector assembly having a socket; and an extraction device engageable with the socket; providing an electrical component on the socket connector assembly; and moving said extraction device relative to said socket.

BRIEF DESCRIPTION OF THE DRAWINGS

Other uses and advantages of the present invention will become apparent to those skilled in the art upon reference to the specification and the drawings, in which.

DETAILED DESCRIPTION OF THE PREFERRED EMBODIMENTS

Figure 1:
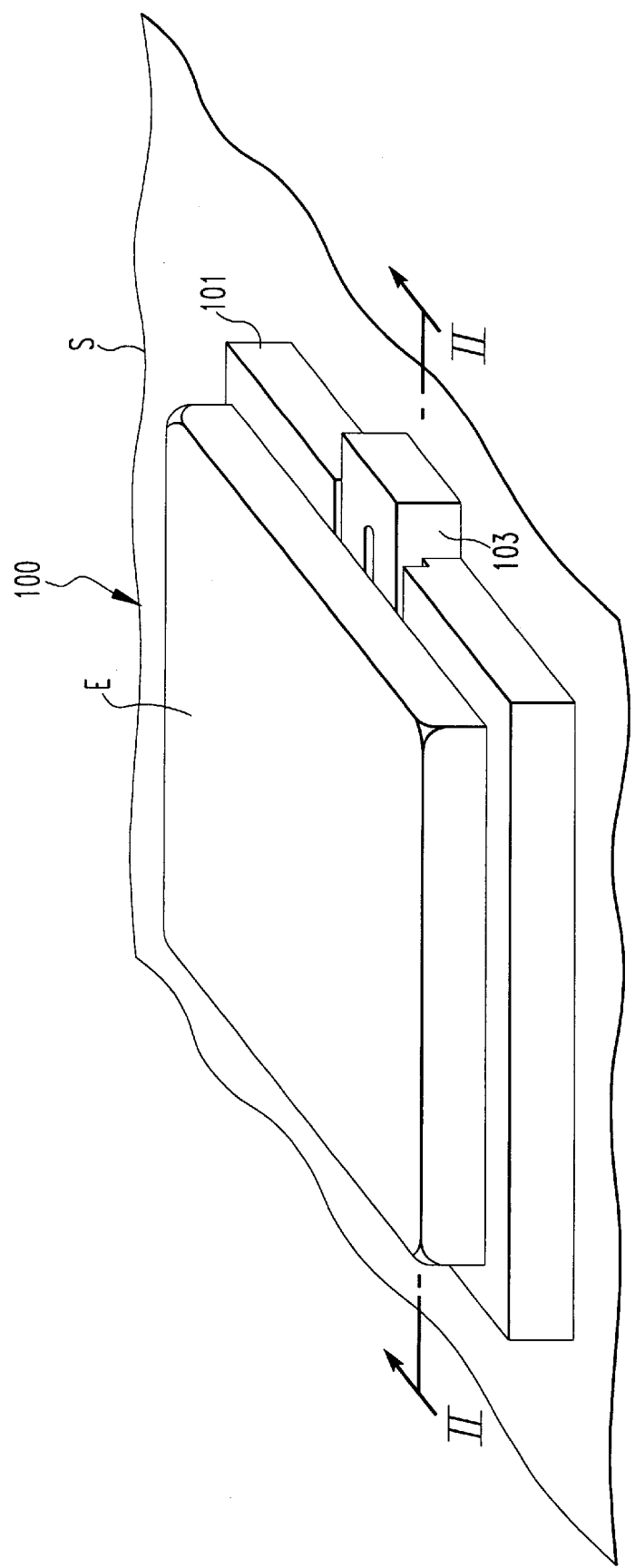
FIG. 1 is a perspective view of one alternative embodiment of the present invention.

FIGS. 1–12 display several alternative embodiments of the present invention. Generally speaking, the present invention is a socket connector assembly that couples an electrical component E to a substrate S, such as a printed circuit board. The assembly also has features that assist in the extraction of electrical component E from the socket connector assembly.

The socket connector assembly has integratable two parts, a socket housing and a slide. The socket housing mounts to substrate S and has an array of apertures that receive conductive elements, such as pins P, extending from electrical component E. The socket housing also has structure that interacts with corresponding structure on the slide to help extract electrical component E from the socket connector assembly.

The slide engages the socket housing and supports the electrical component. The slide includes structure corresponding to the structure on the socket housing. Movement of the slide across the housing helps extract electrical component E from the socket connector assembly. More specifically, as the slide is moved across the socket housing, the structures on the slide and on the socket housing interact to direct electrical component E away from substrate S along the insertion axis.

In other words, the corresponding structure on the socket housing and the slide interact to transform some of the movement of the slide across the housing (from a mating position to an extraction position) into a displacement of the slide away from substrate S along the insertion axis. Since electrical component E rests at least partially on the slide, the displacement of the slide also urges electrical component E away from substrate S along the insertion axis. This helps extract pins P from the terminals. The corresponding structure will now be described in detail.

A detailed discussion of each alternative embodiment of the socket connector assembly of the present invention follows. FIGS. 1–7 display a first alternative embodiment of the present invention.

A socket connector assembly 100 couples electrical component E to substrate S. Assembly 100 includes an integratable socket housing 101 and a slide 103. Socket housing 101 can be generally planar and made from a suitable insulative material. Socket housing 101 has a mounting end 105 that faces substrate S and a mating end 107 that faces electrical component E.

Electrical component E partially rests on mating end 107 of housing 101. The remainder of electrical component E rests on slide 103. Apertures 109 extend between mounting end 105 and mating end 107 of housing 101. Apertures 109 receive pins P of electrical component E.

Conductive terminals 111 reside within apertures 109. Terminals 111 can remain in apertures 109, for example, by an interference fit. Terminals 111 electrically connect component E to substrate S.

The present invention interposes slide 103 between housing 101 and electrical component E. Slide 103 helps extract component E from housing 101. Extraction occurs due to the interaction of corresponding structure on both housing 101 and slide 103.

Slide 103 can be generally planar and made from any suitable insulative material. Slide 103 has a mating end 113 that faces electrical component E and a mounting end 115 that faces housing 101. Electrical component E rests on mating end 113. Mounting end 115 rests on housing 101.

Figure 2:
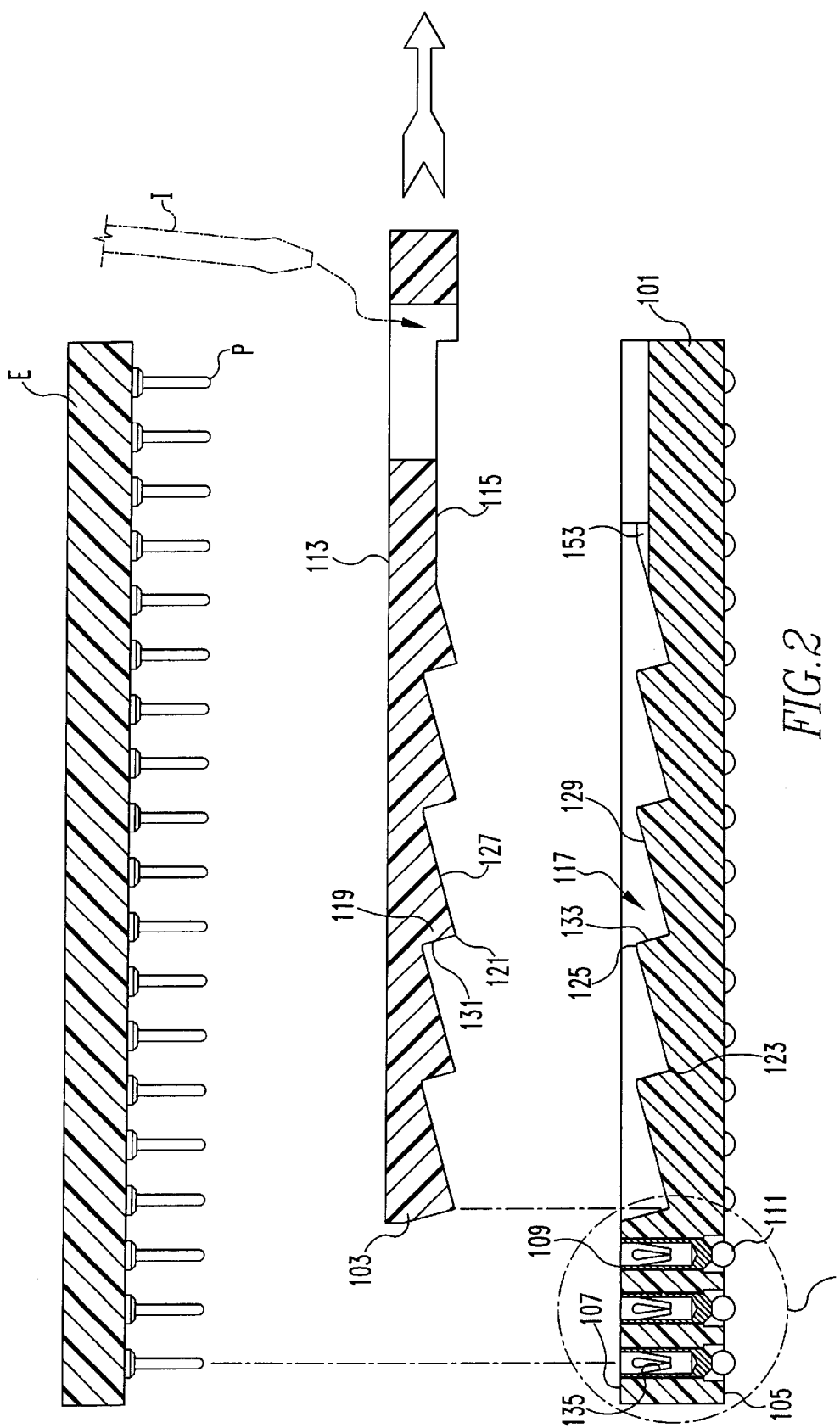
FIG. 2 is an exploded, cross-sectional view taken along lines II—II in FIG. 1.
Figure 3:
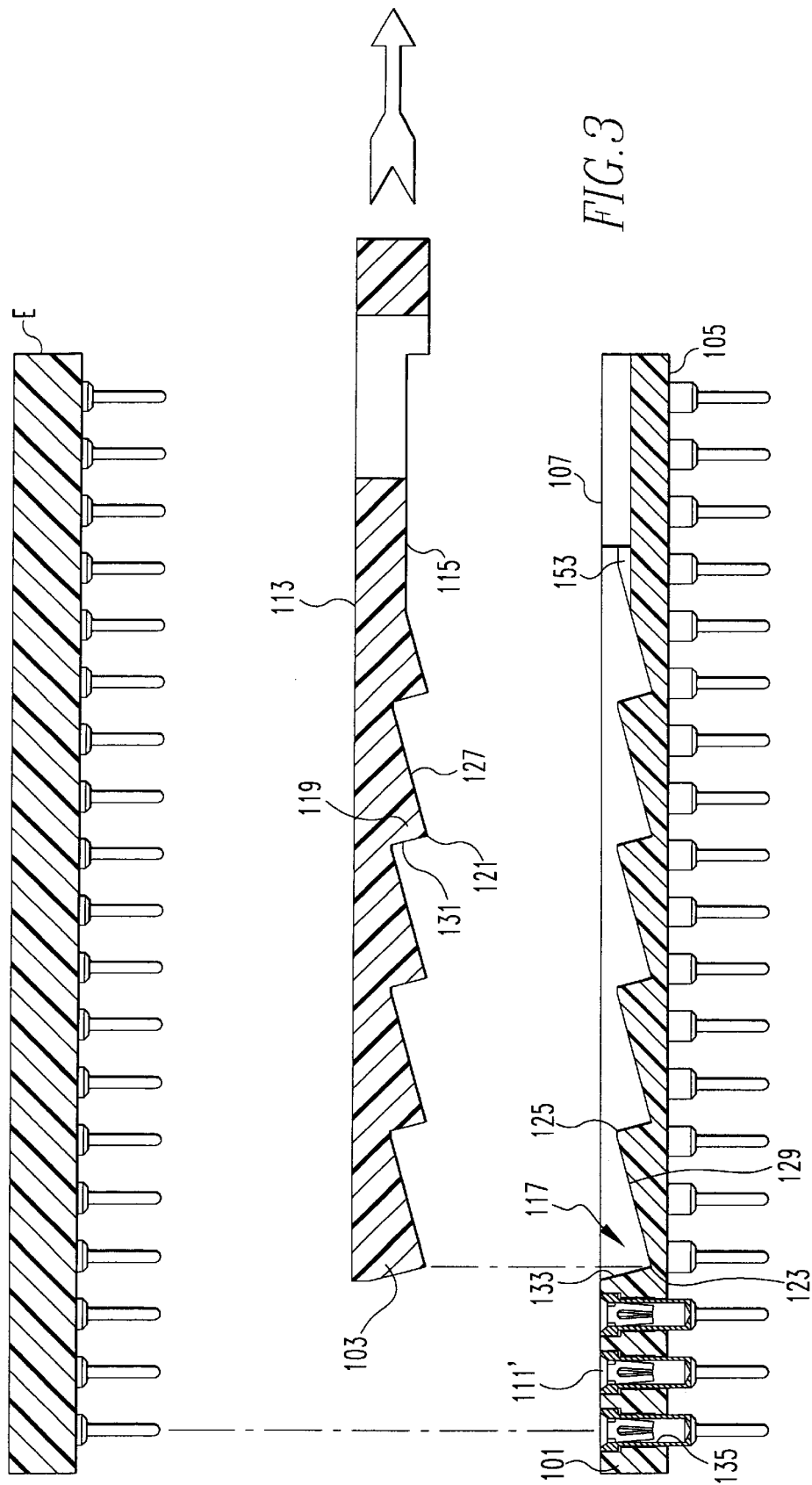
FIG. 3 is an exploded, cross-sectional view of an alternative arrangement of the first alternative embodiment of the present invention.

Slide 103 moves on housing 101 between a mating position and an extraction position along the arrow shown in FIGS. 2 and 3. In the mating position, slide 103 rests on housing 101 so as to avoid interference with the mating of pins P of electrical component E with terminals 111 on housing 101. In the extraction position, slide rests on housing 101 in such a position that pins P of electrical component E cannot mate with terminals 111 of housing 101. Therefore, manipulation of slide 103 across housing 101 from the mating position to the extraction position disengages pins P from terminals 111.

The corresponding structure on housing 101 and slide 103 helps extract electrical component E from socket connector assembly 100. The corresponding structure on housing 101 and slide 103 interact to transform some of the movement of slide 103 across housing 101 in the direction of the arrow in FIGS. 2 and 3 (from the mating position to the extraction position) into a displacement of slide 103 away from substrate S along the insertion axis. Since electrical component E partially rests on slide 103, the displacement of slide 103 also urges electrical component E away from substrate S along the insertion axis in order to extract pins P from terminals 111. The corresponding structure will now be described in detail.

Figure 4:
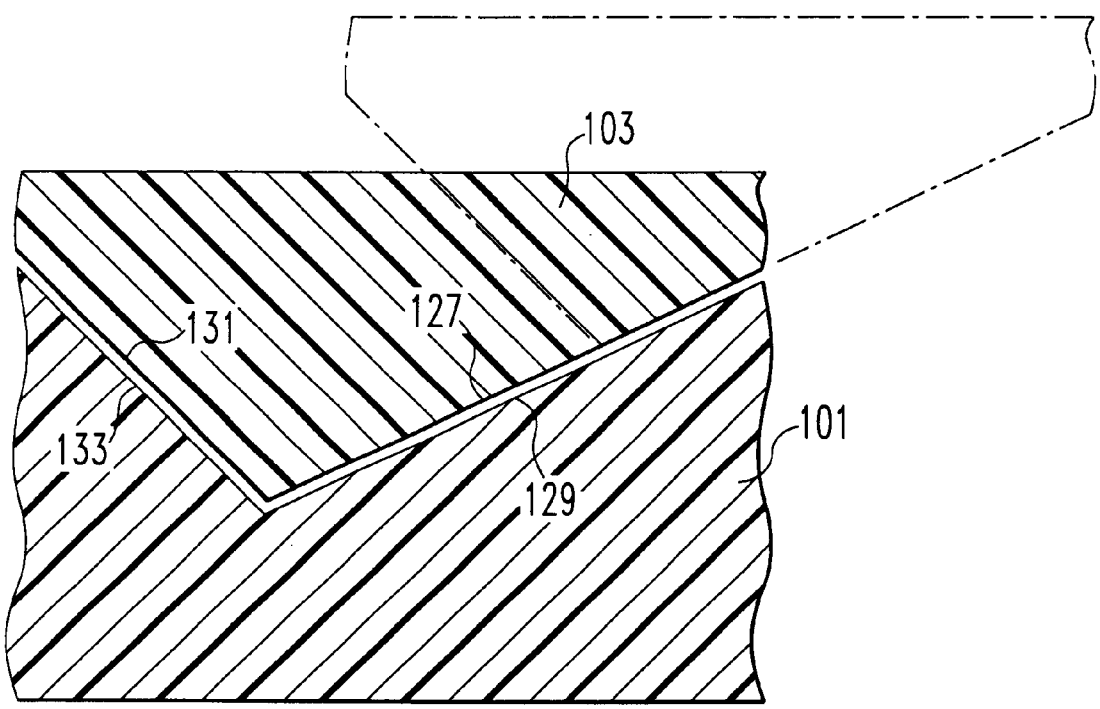
FIG. 4 is a cross-sectional view of a portion of the first alternative embodiment of the present invention.

Housing 101 and slide 103 can have interfitting notches 117 and projections 119. The location of projections 119 within notches 117 determines the mated height of socket connector assembly 100. When projections 119 fully nest within notches 117 as shown in FIG. 4, slide 103 is in the mating position. As an example, a peak 121 of projection 119 abuts a valley 123 of notch 117 when slide 103 is in the mating position. In the mating position, pins P can mate with terminals 111. Socket connector assembly 100 exhibits its lowest mated height in the mating position. This assists the interaction of pins P and terminals 111.

As slide 103 moves across housing 101 along the arrow shown in FIG. 2 and 3 from the mating position towards the extraction position, projections 119 withdraw from the fully nested position. As projections 119 withdraw, the mated height of socket connector assembly 100 increases as shown in phantom in FIG. 4. The mated height eventually increases enough to prevent pins P from mating with terminals 111. In other words, as slide 103 moves across housing 101 along the direction of the arrow shown in FIGS. 2 and 3, slide 103 extracts pins P from terminals 111 of housing 101, eventually removing pins P from contact with terminals 111. Slide 103 attains the extraction position, for example, when peak 121 of projection 119 approaches a peak 125 of notch 117. At the extraction position, pins P cannot mate with terminals Notches 117 and projections 119 can have a triangular cross-section, although other shapes could be used. With triangular cross-sections, a major surface 127 of projection 119 slides along a major surface 129 of notch 117 as seen in FIG. 4. Slide 103 moves from its mating position to its extraction position along the direction of the arrow in FIGS. 2 and 3. In the mating position, a minor surface 131 of projection 119 abuts a minor surface 133 of notch 117 as seen in FIG. 4.

The inclination of major surfaces 127, 129 causes the increase in mated height of socket connector assembly 100 as slide 103 moves from its mating position to its extraction position. As stated above, socket connector assembly 100 displays its smallest mated height when projections 119 fully nest within notches 117. The mated height of socket connector assembly 100 increases as projection 119 travels along inclined major surface 129 of notch 117.

Figure 5:
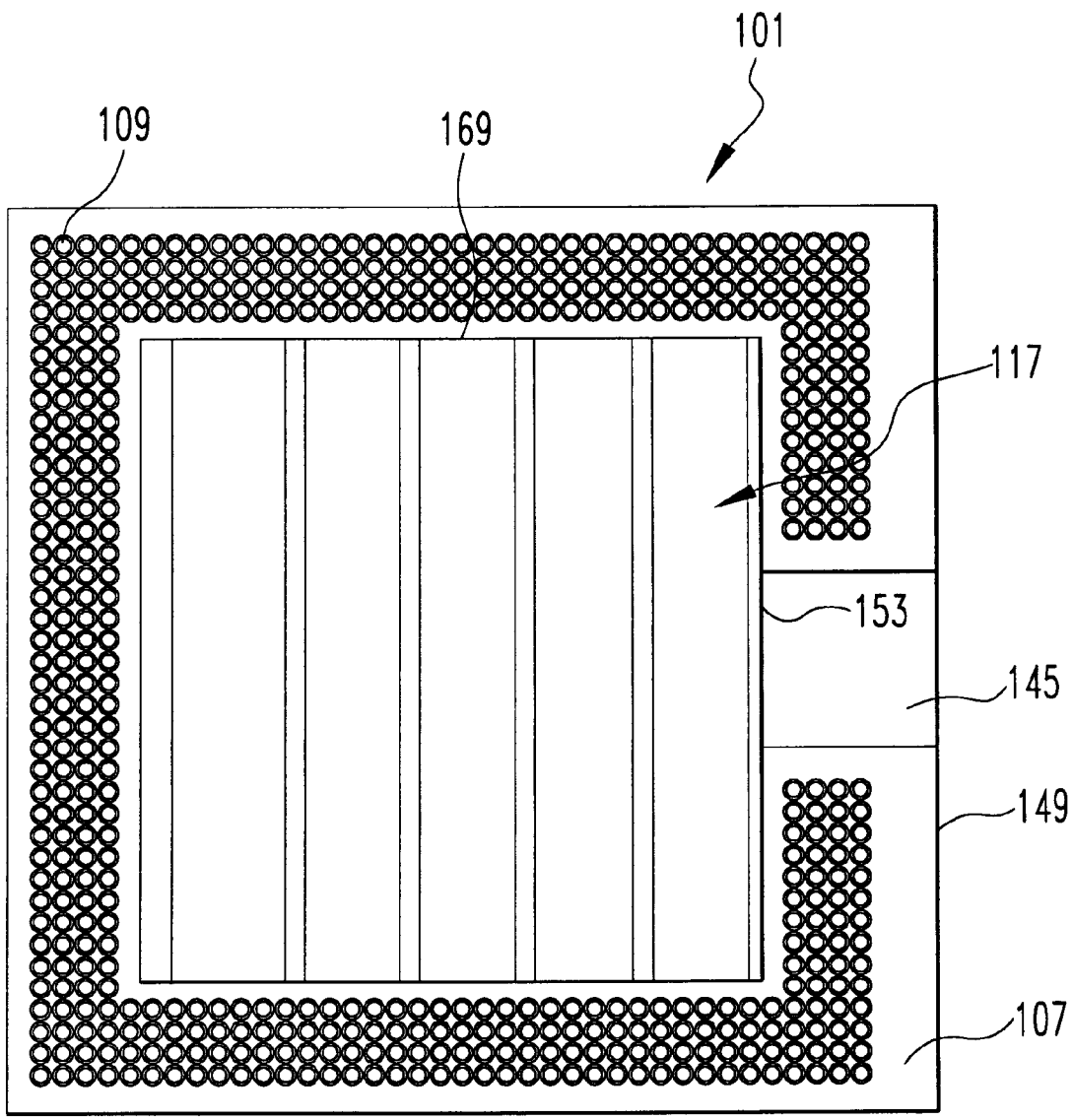
FIG. 5 is a plan view of one component of the first alternative embodiment of the present invention.
Figure 6:
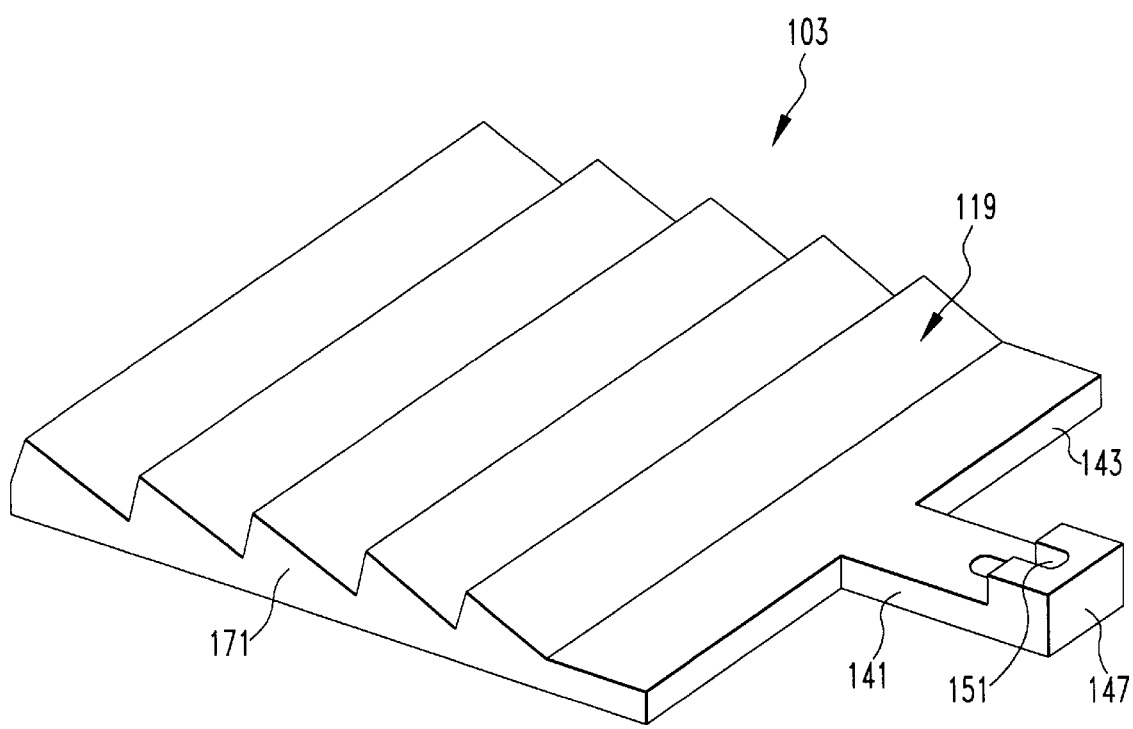
FIG. 6 is a perspective view of a second component of the first alternative embodiment of the present invention.

The first alternative embodiment of the present invention accommodates an electrical connector in which its pins extend around only the periphery, leaving the central portion devoid of any pins. FIG. 5 displays housing 101 capable of receiving peripherally located pins P on electrical component E. Apertures 109 reside around the periphery of housing 101, while notches 117 occupy a central location on mating end 107 of housing 101.

Slide 103 rests on housing 101. In order to avoid interference with apertures 109, slide 103 has a smaller peripheral extent than housing 101. Except for the portion of slide 103 seen in FIG. 1, which is described below, slide 103 resides beneath electrical component E and rests on housing 101.

Notches 117 and projections 119 preferably extend in a direction across the width of housing 101 and slide 103, respectively. Stated differently, notches 117 and projections 119 extend in a direction that is perpendicular to the movement direction of slide 103 (shown as the arrow in FIGS. 2 and 3).

Due to the peripheral location of apertures 109, notches 117 do not extend across the entire width of housing 101. In other words, notches 117 only extend across the central portion of housing 101. This creates a wall 169 at the interface between the peripheral area and the central portion of housing 101. Wall 169 abuts side walls 171 of slide 103 to ensure proper alignment of slide 103 in housing 101 as slide 103 moves from its mating position to its extraction position.

In order to move slide 103 across housing 101, slide 103 has a tab 141 extending from a leading edge 143. When slide 103 rests on housing 101, tab 141 rests in a notch 145 in housing 101. With slide 103 in the mating position, a block 147 on tab 141 rests against a leading edge 149 of housing 101. As slide 103 moves from its mating position to its extraction position, notch 145, in a fashion similar to wall 169, keeps slide 103 in proper alignment with housing 101.

Tab 141 includes a slot 151. Slot 151 can receive an implement, such as the blade of a screwdriver, used to move slide 103 from its mating position to its extraction position. When desired, the user inserts the implement into slot 151 and urges slide 103 in the direction of the arrow in FIGS. 2 and 3.

As slide 103 continues to move along housing 101 in the direction of the arrows in FIGS. 2 and 3, leading edge 143 abuts a catch 153. Catch 153 prevents further movement of slide 103 over housing 101. In this condition, slide 103 is in the extraction position.

Figure 7:
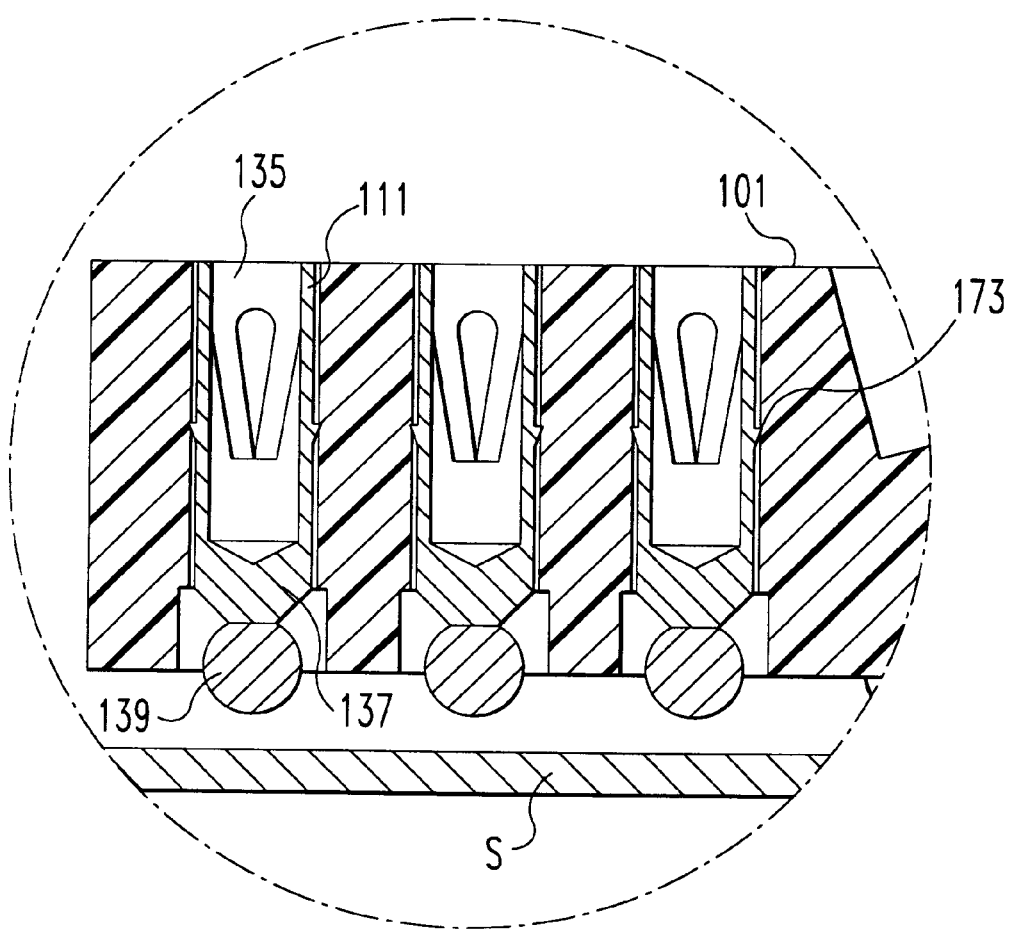
FIG. 7 is a detailed view of a portion of FIG. 2 appearing in the dashed circle.

FIGS. 2 and 7; and 3 and 7a, respectively, demonstrate two alternative methods of securing housing 101 to substrate S. In both instances, terminals 111, 111' secure housing 101 to substrate S and are press-fit type terminals having cantilevered arms 135 that flex upon insertion of pins P. The compliant nature of arms 135 ensures a suitable electrical connection between pins P and terminals 111. In addition, both terminals 111, 111' have barbs 173, 173' that pierce the wall forming the apertures in the housing for retaining terminals 111, 111' within the housing. Barbs 173, 173' pierce the wall upon insertion of terminals 111, 111' into the housing, The present invention uses terminals 111 shown in FIGS. 2 and 7 when surface mounting housing 101 to substrate S. Terminals 111 have a distal end 137 that receives a fusible element 139, such as a solder ball. Fusible element 139 secures to distal ends 137 of terminals 111 using reflow techniques, preferably ball grid array (BGA) technology. International Publication number WO 98/15989 (International Application number PCT/US97/18066), herein incorporated by reference describes methods of securing a fusible element to a contact, and a contact to a substrate.

Figure 7A:
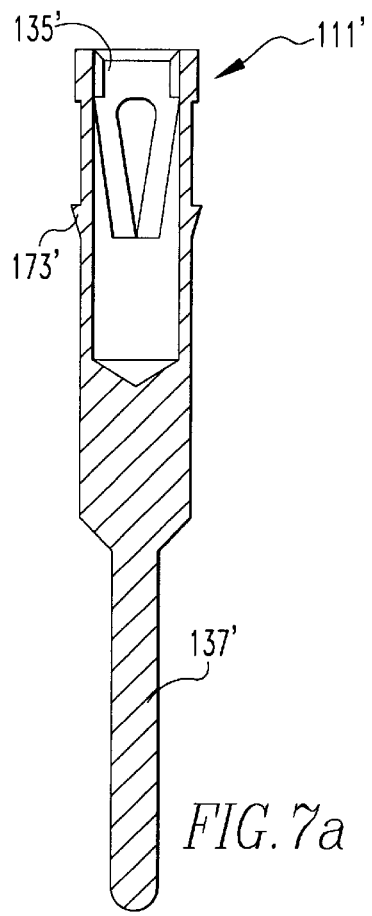
FIG. 7a is a cross-sectional view of the alternative embodiment of the terminal appearing in FIG. 3.

The present invention uses terminals 111' shown in FIGS. 3 and 7a when mounting housing 101 to plated through holes (not shown) in substrate S. Distal ends 137' of terminals 111' are elongated compared to the other embodiments so that terminals 111' can enter the through holes. With extended distal ends 137' within the through holes, terminals 111' are soldered to substrate S using known techniques.

Figure 7B:
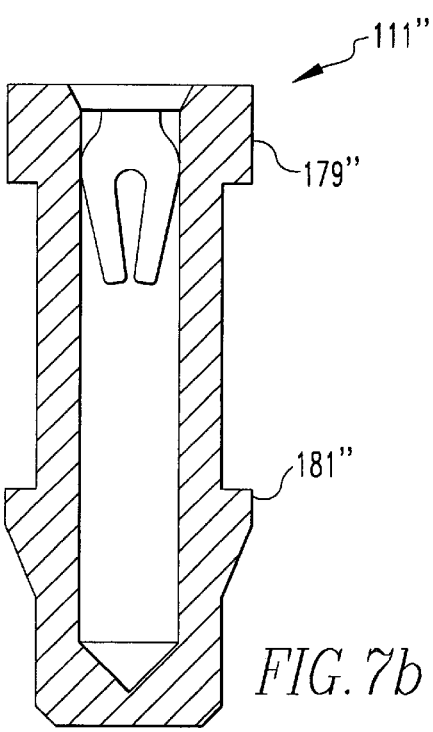
FIG. 7b is a cross-sectional view of another alternative embodiment of a terminal of the present invention.

FIG. 7b displays another alternative embodiment of the terminal. As with the other embodiments, terminal 111" uses compliant arms 135" for engaging pins P. In a manner different than the other embodiments, terminal 111" is a floating pin design.

Terminal 111" has an upper collar 179" and a lower collar 181" that, when fully inserted into the aperture in the housing, flank the housing. In other words, the medial portion of terminal 111" extending between collars 179", 181" resides within the aperture in the housing. The remainder of terminal 111" resides outside of the aperture.

The length of the medial portion extending between collars 179", 181" is greater than the thickness of the housing. The amount of difference determines the degree of movement of terminal 111" in the Z-axis (i.e. normal to the plane of the housing) when inserted into the aperture. Z-axis movement of terminal 111" helps offset coplanarity differences between the top of the substrate and the bottom of the housing.

The diameter of the medial portion of terminal 111" extending between collars 179", 181" is less than the diameter of the aperture in the housing in order to allow unrestricted float in the Z-axis and also to allow movement of terminal 111" in the X and Y-axes (i.e. parallel to the plane of the housing). Allowing movement of terminal 111" in the X and Y-axes helps reduce the effects of any difference between the coefficient of thermal expansion (CTE) of the housing and of the substrate.

FIGS. 8–12 display a second alternative embodiment of the present invention. Features similar to the other alternative embodiments use the same reference character, save a change in the hundreds digit. A socket connector assembly 200 couples electrical component E to substrate S. Assembly 200 includes an integratable socket housing 201 and a slide 203.

Socket housing 201 can be generally planar and made from a suitable insulative material. Socket housing 201 has a mounting end 205 that faces substrate S and a mating end 207 that faces electrical component E.

Apertures 209 extend between mounting end 205 and mating end 207 of housing 201. Apertures 209 receive pins P of electrical component E. Conductive terminals 111 interference fit within apertures 109 to electrically connect component E to substrate S.

The present invention interposes a slide 203 between housing 201 and electrical component E. Slide 203 helps extract component E from housing 201. Corresponding structure on both housing 201 and slide 203 interact to extract electrical component E from housing 201.

Slide 203 can be generally planar and made from any suitable insulative material. Slide 203 has a mating end 213 that faces electrical component E and a mounting end 215 that faces housing 201. Electrical component E rest on mating end 213. Mounting end 215 rests on housing 201.

Figure 9:
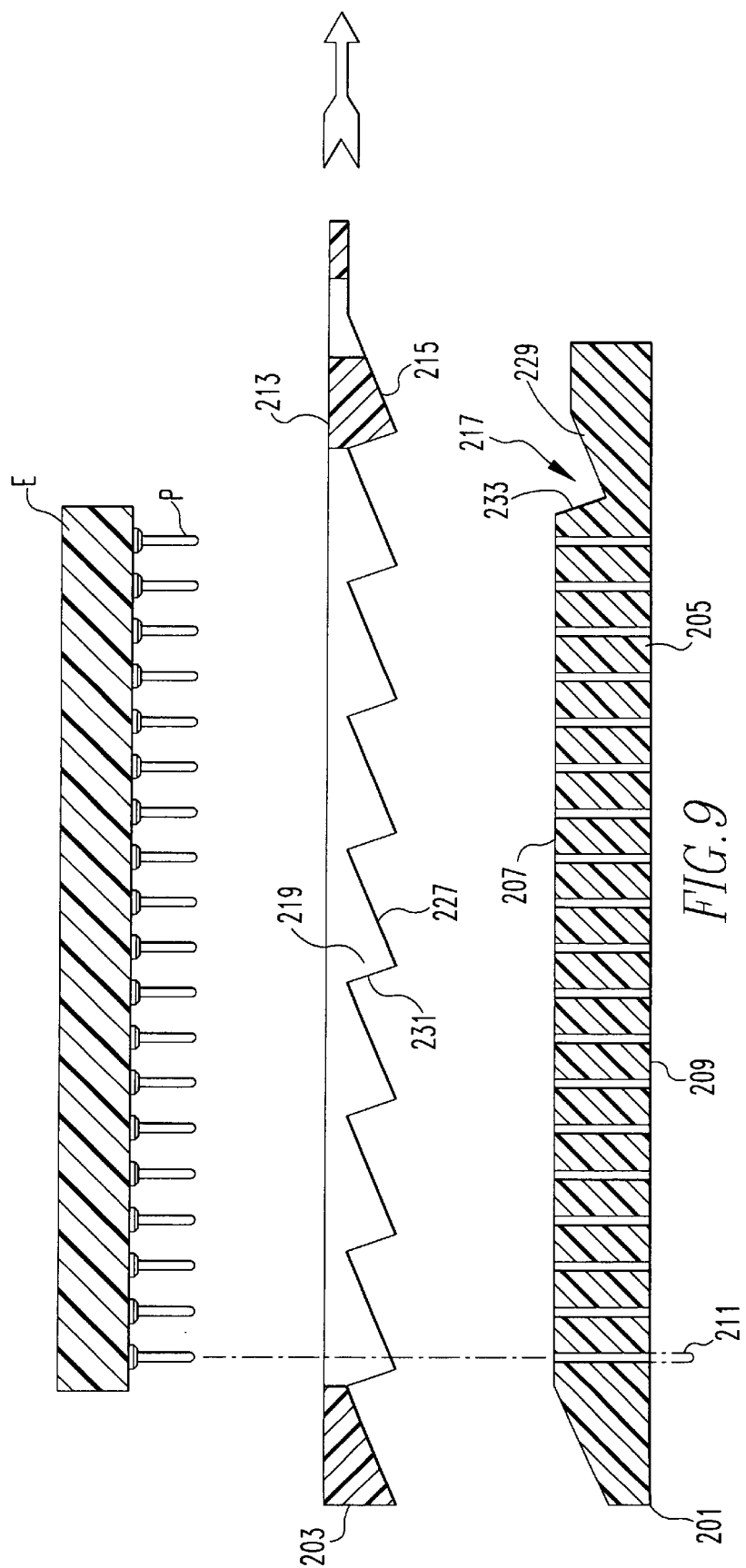
FIG. 9 is an exploded, cross sectional view taken along lines IX—IX in FIG. 8.

Slide 203 moves on housing 201 between a mating position and an extraction position along the arrow shown in FIGS. 9. In the mating position, slide 203 rests on housing 201 so that pins P of electrical component E may mate with terminals 211 of housing 201. In the extraction position, slide 203 rests on housing 201 in such a position that pins P of electrical component E cannot mate with terminals 211 of housing 201. Therefore, manipulation of slide 203 across housing 201 from the mating position to the extraction position disengages pins P from terminals 211.

The corresponding structure on housing 201 and slide 203 helps extract electrical component E from socket connector assembly 200. The corresponding structure on housing 201 and slide 203 interact to transform some of the movement of slide 203 across housing 201 in the direction of the arrow in FIG. 9 (from the mating position to the extraction position) into a displacement of slide 203 away from substrate S along the insertion axis. Since electrical component E rests on slide 203, the displacement of slide 203 also urges electrical component E away from substrate S along the insertion axis in order to extract pins P from terminals 211. The corresponding structure will now be described in detail.

Housing 201 and slide 203 can have interfitting notches 217 and projections 219. The location of projections 219 within notches 217 determines the mated height of socket connector assembly 200. When projections 219 fully nest within notches 217, slide 203 is in the mating position. The mating position of slide 203 allows pins P to mate with terminals 211. Socket connector assembly 200 exhibits its lowest mated height in the mating position in order to allow the interaction of pins P and terminals 211.

As slide 203 moves across housing 201 along the arrow shown in FIG. 9 from the mating position towards the extraction position, projections 219 withdraw from the fully nested position. As projections 219 withdraw, the mated height of socket connector assembly 200 increases. The mated height eventually increases enough to prevent pins P from mating with terminals 211. In other words, as slide 203 moves across housing 201 along the direction of the arrow shown in FIG. 9, slide 203 extracts pins P from terminals 211 of housing 201, eventually removing pins P from contact with terminals 211. At the extraction position, pins P cannot mate with terminals 211.

Notches 217 and projections 219 can have a triangular cross-section, although other shapes could be used. With triangular cross-sections, a major surface 227 of projection 219 slides along a major surface 229 of notch 217. Slide 203 moves from its mating position to its extraction position along the direction of the arrow in FIG. 9. In the mating position, a minor surface 231 of projection 219 abuts a minor surface 233 of notch 217.

The inclination of major surfaces 227, 229 causes the increase in mated height of socket connector assembly 200 as slide 203 moves from its mating position to its extraction position. As stated above, socket connector assembly 200 displays its smallest mated height when projections 219 fully nest within notches 217. The mated height of socket connector assembly 200 increases as projections 219 travel along inclined major surfaces 229 of notches 217.

Figure 10:
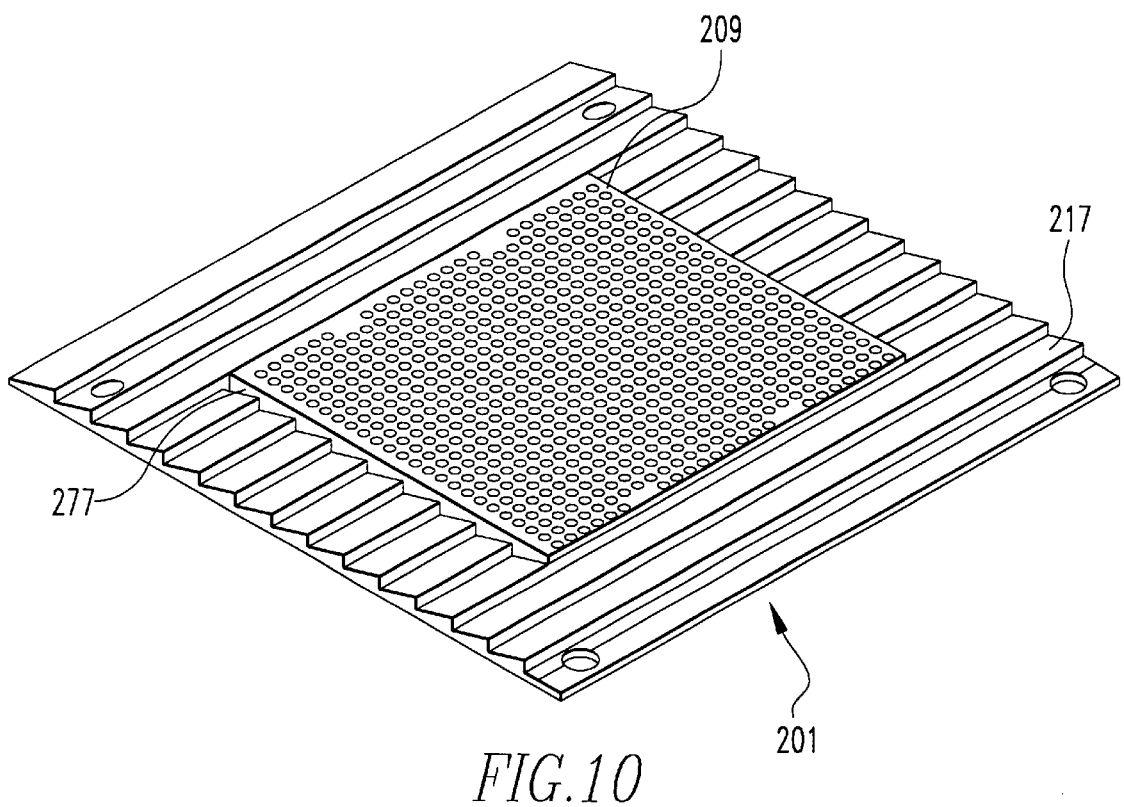
FIG. 10 is a perspective view of one component of the second alternative embodiment of the present invention.
Figure 11:
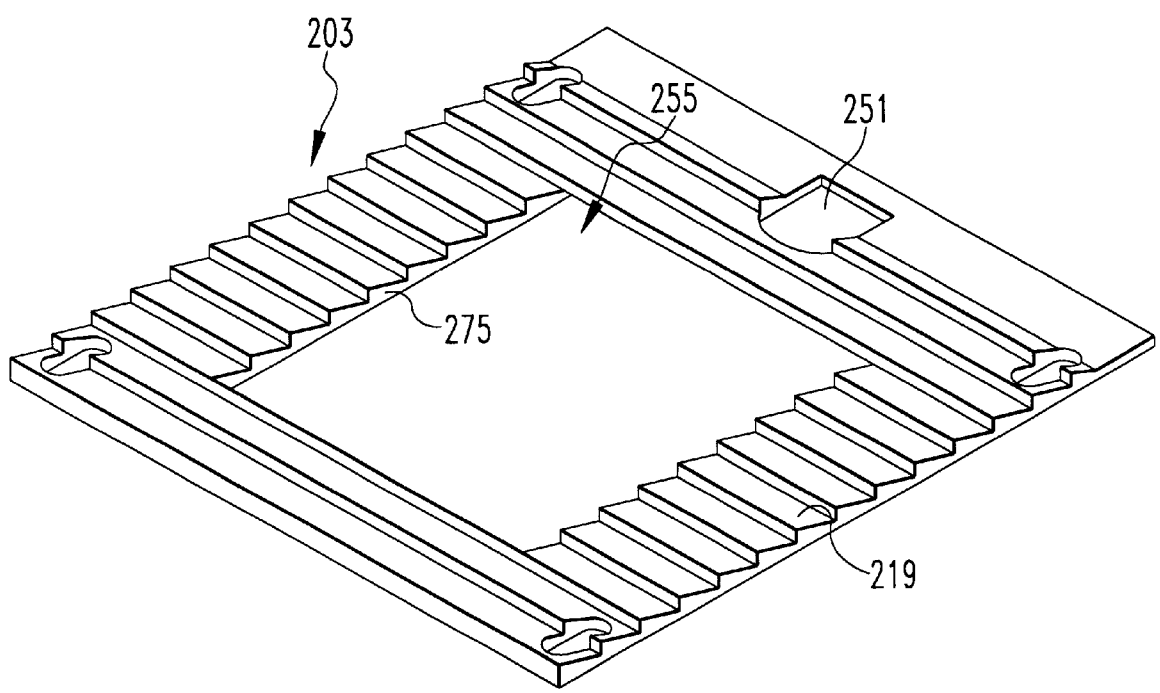
FIG. 11 is a perspective view of a second component of the second alternative embodiment of the present invention.

In this alternative embodiment of the present invention, socket connector assembly 200 accommodates an electrical connector with pins residing on the entire lower surface of electrical connector E. FIG. 10 displays housing 201 capable of receiving such pins P on electrical component E. Apertures 209 occupy the center of housing 201, while notches 217 extend around the periphery of mating end 207 of housing 201.

Figure 8:
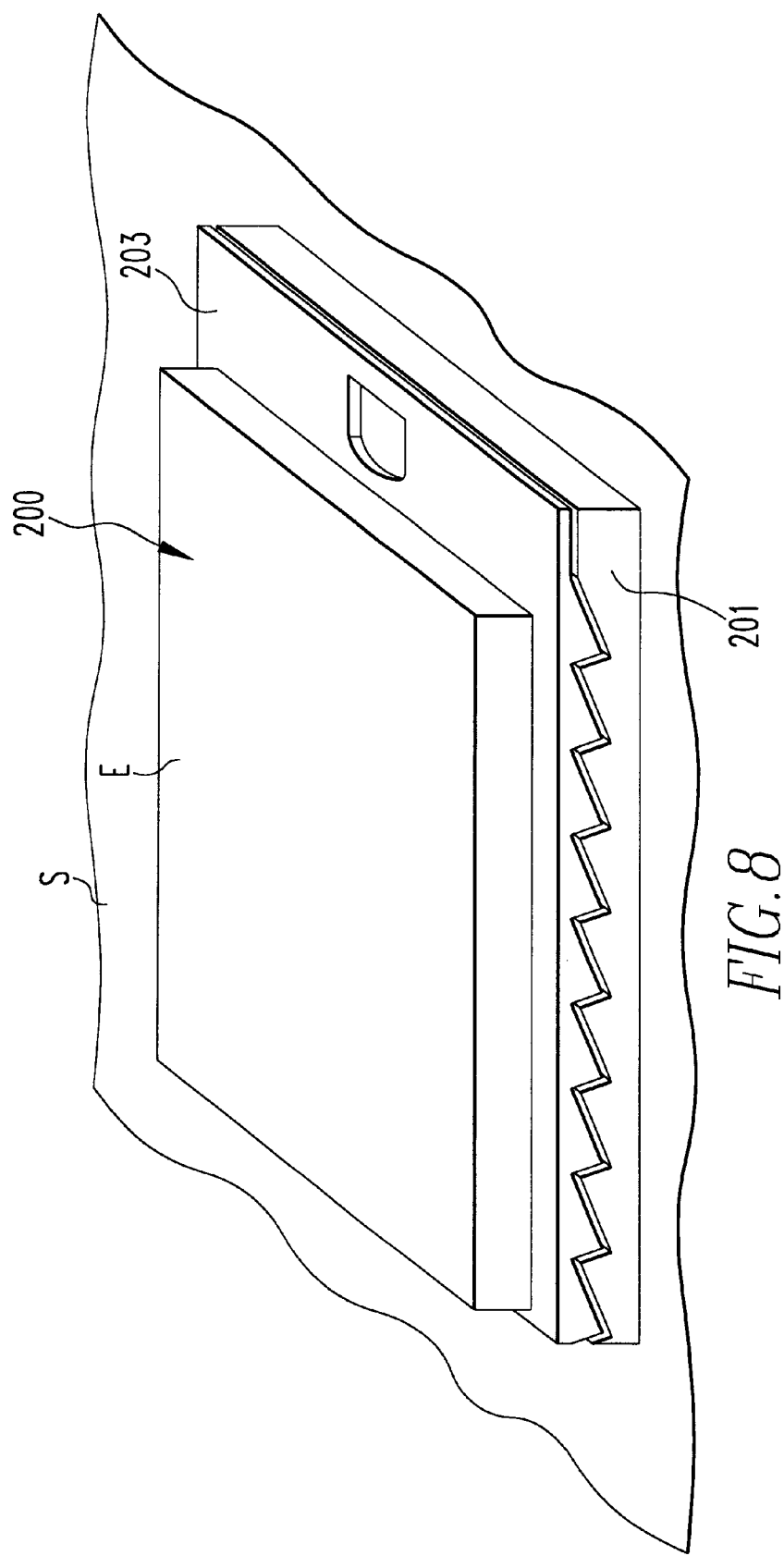
FIG. 8 is a perspective view of another alternative embodiment of the present invention.

Slide 203 rests on housing 201 and resides between electrical component E and housing 201. As seen in FIG. 8, slide 203 can have the same peripheral extent as housing 201. Slide 203 includes a central opening 255 that allows electrical component E to interact with apertures 209 on housing 201. Walls 275 define opening 255. Upon insertion of pins P into terminals 211, electrical component E rests on mating end 213 of slide 203.

Notches 217 and projections 219 preferably extend in a direction across the width of housing 201 and slide 203, respectively. Stated differently, notches 217 and projections 219 extend in a direction that is perpendicular to the movement direction of slide 203 (shown as the arrow in FIG. 9).

Due to central opening 255, several projections 219 cannot extend across the entire width of slide 203. In other words, several projections 219 are discontinuous across the width of slide 203.

Walls 275 of slide 203 and walls 277 of housing 201 defining the interface between the central portion and the periphery of housing 201 control the movement of slide 203 on housing 201 between its mating position and its extraction position. As slide 203 travels along housing 201 in the direction of the arrow in FIG. 9, walls 275, 277 abut for precise alignment.

In order to move slide 203 across housing 201, slide 203 has a slot 251 that can receive an implement. When desired, the user inserts the implement into slot 251 and urges slide 203 in the direction of the arrow in FIG. 9.

Figure 12:
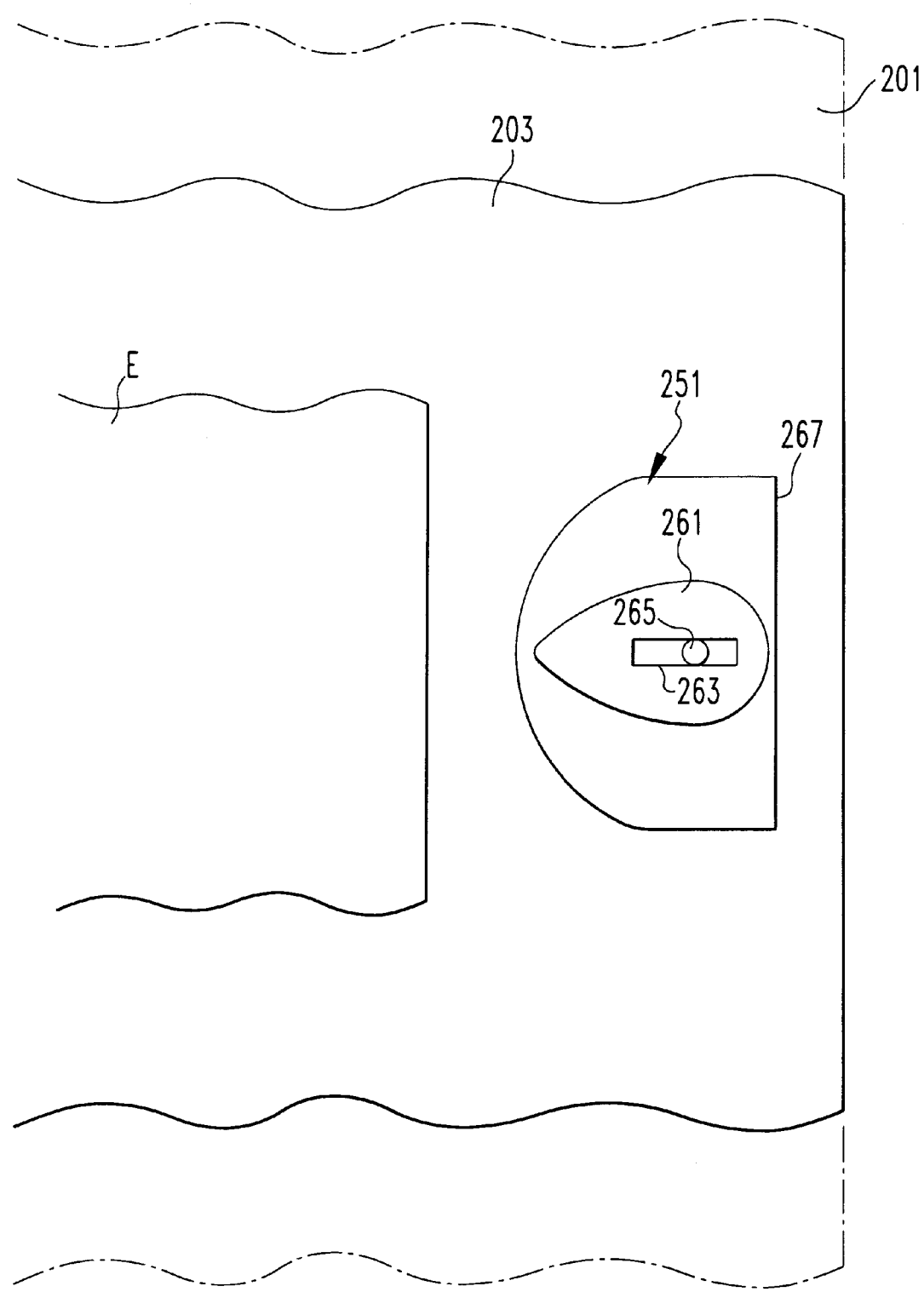
FIG. 12 is a plan view of an alternative arrangement for the second alternative embodiment of the present invention.

In the alternative arrangement shown in FIG. 12, slot 251 receives an eccentric cam 261 rotatably mounted on mounting end 207 of housing 201 by a pin 263. In one embodiment, cam 261 includes a slot 265 to receive an implement, such as the blade of a screwdriver, used to rotate cam 261. The user inserts the implement and rotates cam 261.

In the mating position of slide 203 shown in FIG. 12, cam 261 does not engage opening 251 of slide 203. To move slide 211 from its mating position to its extraction position, the user rotates cam 261. Upon rotation of cam 261 from the position shown in FIG. 12, cam 261 eventually engages a leading edge 267 of slot 251. Further rotation of cam 261 urges slide 203 to its extraction position.

In an alternative embodiment (not shown), cam 261 could have a handle (not shown) that allows the user to grasp cam 261 and to manually rotate cam 261. This alternative embodiment does not require the use of the implement described above.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An extraction apparatus mountable to a socket for unmating an electrical component from the socket, the electrical component being mated with the socket in a first insertion direction, the apparatus comprising:
   an insulative housing, having;
   an electrical component receiving surface for receiving the electrical component thereon; and
   a socket contacting surface for contacting the socket;
   wherein the apparatus is adapted to slide in a second direction generally along the socket and simultaneously move in a third different direction generally opposite said first insertion direction so as to urge the electrical component in the third direction generally away from the socket to disconnect the component from the socket, and wherein said socket contacting surface is undulant.

2. The apparatus as recited in claim 1, wherein said socket contacting surface comprises a plurality of serrations.

3. The apparatus as recited in claim 2, wherein said serrations have a triangular cross-section.

4. The apparatus as recited in claim 3, wherein said serrations each have a substantially similar cross-sectional size.

5. The apparatus as recited in claim 2, wherein said plurality of serrations extend across a width of said housing.

6. The apparatus as recited in claim 5, wherein said serrations extend across the entire width of said housing.

7. The apparatus as recited in claim 5, wherein at least a portion of said serrations are discontinuous across the width of said housing.

8. The apparatus as recited in claim 1, further comprising an alignment slot to guide the apparatus relative to the socket.

9. The apparatus as recited in claim 1, further comprising an opening extending between said electrical component receiving surface and said socket contacting surface for receiving a portion of the electrical component.

10. The apparatus as recited in claim 9, wherein said opening is centrally located on said housing.

11. The apparatus as recited in claim 1, further comprising an opening in said housing adapted to receive an implement for imparting motion to the apparatus.

12. A socket for receiving an electrical component having conductive elements, comprising:
   an insulative housing;
   a plurality of apertures extending through said housing and capable of receiving the conductive elements of the electrical component in a first insertion direction; and
   an undulant surface adapted to engage an extraction device for removing the conductive elements from said apertures, so that when the extraction device slides in a second direction along said undulant surface, said undulant surface imparts movement to the extraction device in a third direction generally opposite said first insertion direction to remove the conductive elements from the apertures.

13. The socket as recited in claim 12, further comprising a mounting surface located adjacent a substrate to which the socket mounts, wherein said undulant surface is angled relative to said mounting surface.

14. The socket as recited in claim 12, wherein said undulant surface comprises a plurality of serrations.

15. The socket as recited in claim 14, wherein said serrations have a triangular cross-section.

16. The socket as recited in claim 15, wherein said cross-sections of each of said serrations have a substantially similar size.

17. The socket as recited in claim 14, wherein said serrations extend across a width of the socket.

18. The socket as recited in claim 17, wherein at least a portion of said serrations extend across the entire width of the socket.

19. The socket as recited in claim 17, wherein at least a portion of said serrations are discontinuous across the width of the socket.

20. The socket as recited in claim 12, wherein said apertures are centrally located on said housing.

21. The socket as recited in claim 12, wherein said apertures are peripherally located on said housing.

22. The socket as recited in claim 12, further comprising a cam engageable with the extraction device to impart motion to the extraction device.

23. The socket as recited in claim 12, further comprising a plurality of contacts located in said apertures for receiving the conductive elements of the electrical component.

24. The socket as recited in claim 23, further comprises a plurality of fusible elements each secured to a mounting end of a respective one of said contacts.

25. The socket as recited in claim 24, wherein said fusible elements comprise solder balls.

26. A kit for attaching an electrical component having conductive elements to a substrate and for removing the electrical component from the substrate, comprising:
   a socket including a mating end having a plurality of apertures capable of receiving the conductive elements of the electrical component along an insertion axis; and
   an extraction device placeable between said mating end of said socket and the electrical component, slidable along said socket between a first extended position relative to the mating end of the socket and a second retracted position relative to the mating end of the socket, and comprising a receiving surface for engaging the electrical component;
   wherein said socket and said extraction device comprise projections and recesses which are misaligned with each other at the second position to prevent the conductive elements from residing within the apertures of the socket in the first extended position, wherein at said first position, said extraction device allows the conductive elements of the electrical component to reside within said apertures of said socket, and, at said second position, said extraction device prevents the conductive elements of the electrical component from residing within said apertures of said socket.

27. The kit as recited in claim 26, further comprising the electrical component connected to the socket.

28. The kit as recited in claim 27, wherein said electrical component is a pin grid array component.

29. The kit as recited in claim 28, wherein said pin grid array component is an integrated circuit chip.

30. A method of extracting an electrical component from a socket connector assembly, comprising the steps of:
   providing a socket connector assembly, said socket connector assembly comprising:
   a socket; and
   an extraction device engageable with said socket;
   providing an electrical component mated with said socket connector assembly in a first insertion direction; and translating said extraction device in a second different direction to move the electrical component in a third direction generally opposite said insertion direction to unmate said component from said socket, wherein the step of translating comprises a plurality of mating projections and recesses in the socket and the extraction device being misaligned to move contacts of the electrical component out of mechanical connection with contacts of the socket.

31. The method of extracting an electrical component as recited in claim 30, further comprising the step of locating said extraction device between said socket and said electrical component.

32. The method of extracting an electrical component as recited in claim 30, wherein the extraction device moving step comprises the steps of:

inserting an implement into an opening in said extraction device; and directing said extraction device with said implement.

33. The method of extracting an electrical component as recited in claim 32, wherein the implement inserting step comprises the steps of:

providing a cam to said socket; and inserting said cam into said opening in said extraction device.

34. The method of extracting an electrical component as recited in claim 30, wherein the extraction device translating step comprises the steps of:

moving said extraction device along said socket;

wherein said extraction device is movable from a first position in which an electrical component engaging surface of said extraction device is located adjacent said socket to a second position in which said electrical component engaging surface is located further away from said socket.

35. The method of extracting an electrical component as recited in claim 34, further comprising the step of surface mounting said socket connector assembly to a substrate.

36. The method of extracting an electrical component as recited in claim 30, wherein said translating step comprises translating said extraction device relative to said socket generally along a line.

\* \* \* \* \*